US008427147B2

(12) United States Patent
Block et al.

(10) Patent No.: US 8,427,147 B2
(45) Date of Patent: Apr. 23, 2013

(54) MAGNETIC RESONANCE IMAGING WITH FAT SUPPRESSION BY COMBINING PHASE ROTATING DATA WITH PHASE SHIFTED DATA IN K-SPACE

(75) Inventors: Walter F. Block, Madison, WI (US); Catherine J. Moran, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 664 days.

(21) Appl. No.: 12/421,704

(22) Filed: Apr. 10, 2009

(65) Prior Publication Data

US 2010/0260397 A1    Oct. 14, 2010

(51) Int. Cl.
    *G01V 3/00*    (2006.01)
(52) U.S. Cl.
    USPC .......................................... 324/307; 324/309
(58) Field of Classification Search .......... 324/300–322; 600/410, 411, 422; 382/128–131
    See application file for complete search history.

(56) References Cited

U.S. PATENT DOCUMENTS

| | | | | |
|---|---|---|---|---|
| 5,262,725 A * | 11/1993 | Cuppen et al. | ................ | 324/312 |
| 5,270,654 A * | 12/1993 | Feinberg et al. | ............... | 324/309 |
| 5,408,180 A * | 4/1995 | Mistretta et al. | ............... | 324/306 |
| 5,570,019 A * | 10/1996 | Moonen et al. | ................ | 324/309 |
| 6,016,057 A * | 1/2000 | Ma | ................................ | 324/309 |
| 6,147,492 A * | 11/2000 | Zhang et al. | .................. | 324/309 |
| 6,265,873 B1 * | 7/2001 | Le Roux | ........................ | 324/309 |
| 6,307,368 B1 | 10/2001 | Vasanawala et al. | | |
| 6,512,371 B2 * | 1/2003 | Prammer | ........................ | 324/303 |
| 6,850,061 B2 * | 2/2005 | Stoyle | ............................. | 324/306 |
| 6,956,371 B2 * | 10/2005 | Prammer | ........................ | 324/303 |
| 7,148,685 B2 * | 12/2006 | Block et al. | .................... | 324/307 |
| 7,298,144 B2 * | 11/2007 | Reeder et al. | .................. | 324/309 |
| 7,518,364 B1 * | 4/2009 | Cukur | ............................. | 324/309 |
| 7,646,198 B2 * | 1/2010 | Bookwalter et al. | .......... | 324/307 |
| 7,800,368 B2 * | 9/2010 | Vaughan et al. | ............... | 324/318 |
| 2004/0008027 A1 * | 1/2004 | Prammer | ........................ | 324/303 |
| 2005/0253579 A1 * | 11/2005 | Block et al. | .................... | 324/307 |
| 2006/0250132 A1 * | 11/2006 | Reeder et al. | .................. | 324/307 |
| 2008/0129298 A1 * | 6/2008 | Vaughan et al. | ............... | 324/322 |
| 2008/0218169 A1 * | 9/2008 | Bookwalter et al. | .......... | 324/309 |
| 2009/0285463 A1 * | 11/2009 | Otazo et al. | .................... | 382/131 |
| 2010/0066365 A1 * | 3/2010 | Bookwalter et al. | .......... | 324/309 |
| 2010/0239151 A1 * | 9/2010 | Dannels et al. | ............... | 382/131 |
| 2010/0260397 A1 * | 10/2010 | Block et al. | .................... | 382/131 |
| 2011/0080166 A1 * | 4/2011 | Edelman et al. | ............... | 324/309 |
| 2011/0241670 A1 * | 10/2011 | Lai et al. | ........................ | 324/309 |
| 2012/0074940 A1 * | 3/2012 | Kimura | ........................... | 324/314 |

* cited by examiner

*Primary Examiner* — Patrick Assouad
*Assistant Examiner* — Tiffany Fetzner
(74) *Attorney, Agent, or Firm* — Quarles & Brady, LLP

(57) ABSTRACT

A three-dimensional projection reconstruction pulse sequence acquires two half echoes in a steady state free precession (SSFP) scan. A method for combining the two echoes to suppress either fat or water in the reconstructed image is described and includes shifting the phase of one echo and combining them in a regridding process used to transform the radial data to a Cartesian grid prior to image reconstruction. Images having either fat or water substantially suppressed are then produced by applying a phase difference mask to images reconstructed from the regridded data. These images are then further processed using information of the phase differences between the two half echoes. In this manner, more consistent and accurate suppression is achieved.

11 Claims, 13 Drawing Sheets

MAGNETIC RESONANCE IMAGING WITH FAT SUPPRESSION BY COMBINING PHASE ROTATING DATA WITH PHASE SHIFTED DATA IN K-SPACE

STATEMENT REGARDING FEDERALLY SPONSORED RESEARCH

This invention was made with United States government support awarded by the following agency: NIH CA116380. The United States government has certain rights in this invention.

CROSS-REFERENCE TO RELATED APPLICATIONS

N/A

BACKGROUND OF THE INVENTION

The field of the invention is nuclear magnetic resonance imaging (MRI) methods and systems. More particularly, the invention relates to steady state free precession (SSFP) methods for acquiring MRI data and suppressing fat signal in reconstructed images.

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_{xy}$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

Most MRI scans currently used to produce medical images require many minutes to acquire the necessary data. The reduction of this scan time is an important consideration, since reduced scan time increases patient throughput, improves patient comfort, and improves image quality by reducing motion artifacts. There is a class of pulse sequences which have a very short repetition time ("TR") and result in complete scans that can be conducted in seconds rather than minutes. Whereas the more conventional pulse sequences have repetition times, TR, which are much greater than the spin-spin relaxation constant, $T_2$, so that the transverse magnetization has time to relax between the phase coherent excitation pulses in successive sequences, the fast pulse sequences have a repetition time, TR, which is less than $T_2$ and which drives the transverse magnetization into a steady-state of equilibrium. Such techniques are referred to as steady-state free precession ("SSFP") techniques.

With the recent introduction of high performance gradient systems on commercially available MRI systems, these SSFP imaging pulse sequences have received more attention. Not only do they significantly shorten scan time, but they also have relatively high signal-to-noise ratio ("SNR") while providing $T_2$-like contrast based on the $T_2/T_1$ ratio of tissues.

Two major problems are associated with the SSFP acquisition method. First, the images produced have undesirably bright lipid signals due to the high $T_2/T_1$ ratio of fat spins. The bright signal complicates clinical interpretation and obscures nearby tissues of greater clinical significance. Second, when using SSFP pulse sequences signal dropout and banding artifacts can appear in regions of $B_0$ field inhomogeneity. To reduce banding artifacts and maximize signal-to-noise ratio ("SNR") efficiency, an extremely short repetition time ("TR") is usually desired.

Two methods to suppress fat in SSFP images are described in U.S. Pat. No. 6,307,368. In the Fluctuating Equilibrium MR ("FEMR") method, RF phase cycling creates transverse magnetization that fluctuates between water and fat signal on alternating pulse sequences. The second method, Linear Combination SSFP ("LCSSFP"), acquires two image datasets with SSFP pulse sequences using different RF phase cycles and then linearly combines the datasets during the image reconstruction. With this approach, image data sets can be combined differently to create both fat and water images without a loss in SNR efficiency.

To operate properly the FEMR and LCSSFP fat suppression methods require the use of a SSFP pulse sequence having a very short repetition period ("TR"). Both FEMR and LCSSFP work best when a 180 degree phase shift occurs between fat and water spins during each TR interval. The ideal repetition time for perfect fat water separation at a $B_0$ field strength of 1.5 Tesla ("T"), therefore, is approximately 2.2 milliseconds ("ms"). However, obtaining such a short TR is difficult without sacrificing readout resolution, which limits the applicability of the method.

By linearly combining the two echoes as described, for example, in U.S. Pat. No. 7,148,685, either fat or water suppression can be achieved. However, the unwanted species is not consistently suppressed. Using this method, either fat or water suppression can be achieved, as shown in FIG. 11A. However, the unwanted species is not suppressed as well as in conventional LC-SSFP, as shown in FIG. 11B. Despite this, the desired passband is still much wider than conventional LC-SSFP, as shown in FIG. 11A. Furthermore, while the phases of the suppressed band can be discriminated, as shown in FIG. 11C, their variation is not uniform across the suppression band. As a result, the phase information contained in the linearly combined image cannot be accurately used to suppress fat.

It would therefore be desirable to provide a method for water-fat separation having a desired passband wider than in conventional LC-SSFP methods, but with greater suppression of unwanted MR signals than previous methods, such as those described in U.S. Pat. No. 7,148,685.

SUMMARY OF THE INVENTION

The present invention is a method for acquiring NMR data with a projection reconstruction pulse sequence from which both a fat suppressed and water suppressed images may be reconstructed. By exciting magnetization at a frequency between fat and water resonances and acquiring NMR data during both dephasing and rephasing lobes of the readout gradient waveform, two echo signals are acquired which can be combined during subsequent image reconstruction to suppress either fat or water. This enables fat suppressed images to be acquired in shorter scan times or at higher resolution or at a higher SNR.

It is an aspect of the invention to provide a method for acquiring an SSFP MR image with fat suppression and without increased scan time or reduced resolution or image SNR. By acquiring two echo signals during the projection reconstruction pulse sequence, two separate radial k-space trajectories are sampled during each TR period. The timing is such that corresponding k-space samples acquired in a central region of k-space can be combined to suppress fat signal without a loss of resolution or image SNR. Fat is further suppressed in an image by producing a phase difference image from phase images reconstructed from two different echo signals. The information in the phase difference image is employed to produce a phase difference mask that is applied to a water image, such that those signals corresponding to fat are substantially suppressed. In this manner, a more consistent and accurate fat suppression is achieved.

It is another aspect of the invention to provide a method of improved fat suppression in MR images. A second signal cancellation step is added at the end of an LC-SSFP reconstruction that assures substantially absolute fat signal cancellation across a range of off-resonance frequencies consistent with fat signal. A phase difference, as opposed to absolute phase, is analyzed as a result of a dual acquisition. Bulk phase offsets between different coils and phase due to field inhomogeneities will cancel out during creation of a phase difference map. This cancellation significantly simplifies reconstruction relative to single pass acquisition methods. This map is then used to create a phase threshold criteria for fat suppression.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
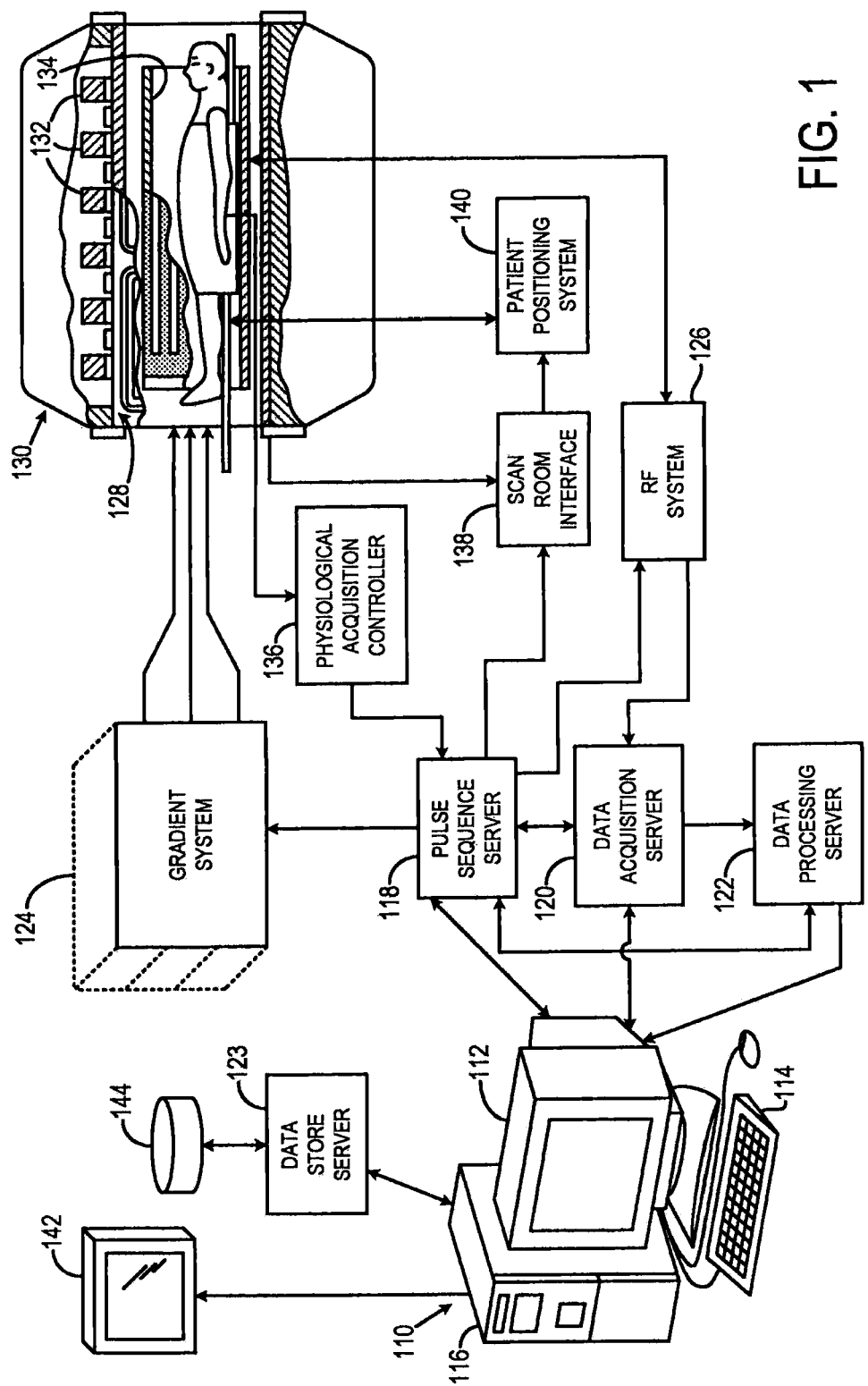
FIG. 1 is a block diagram of an MRI system which employs the present invention.

Referring particularly to FIG. 1, the preferred embodiment of the invention is employed in an MRI system. The MRI system includes a workstation 110 having a display 112 and a keyboard 114. The workstation 110 includes a processor 116 that is a commercially available programmable machine running a commercially available operating system. The workstation 110 provides the operator interface that enables scan prescriptions to be entered into the MRI system. The workstation 110 is coupled to four servers: a pulse sequence server 118; a data acquisition server 120; a data processing server 122, and a data store server 123. The workstation 110 and each server 118, 120, 122 and 123 are connected to communicate with each other.

The pulse sequence server 118 functions in response to instructions downloaded from the workstation 110 to operate a gradient system 124 and an RF system 126. Gradient waveforms necessary to perform the prescribed scan are produced and applied to the gradient system 124 that excites gradient coils in an assembly 128 to produce the magnetic field gradients $G_x$, $G_y$, and $G_z$ used for position encoding MR signals. The gradient coil assembly 128 forms part of a magnet assembly 130 that includes a polarizing magnet 132 and a whole-body RF coil 134.

RF excitation waveforms are applied to the RF coil 134 by the RF system 126 to perform the prescribed magnetic resonance pulse sequence. Responsive MR signals detected by the RF coil 134 or a separate local coil (not shown in FIG. 1) are received by the RF system 126, amplified, demodulated, filtered and digitized under direction of commands produced by the pulse sequence server 118. The RF system 126 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to one or more local coils or coil arrays (not shown in FIG. 1).

The RF system 126 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2},$$

and the phase of the received MR signal may also be determined:

$$\phi = \tan^{-1}\left(\frac{Q}{I}\right).$$

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate", the performance of the scan with the subject's respiration or heart beat.

The pulse sequence server 118 also connects to a scan room interface circuit 138 that receives signals from various sensors associated with the condition of the patient and the magnet system. It is also through the scan room interface circuit 138 that a patient positioning system 140 receives commands to move the patient to desired positions during the scan.

The digitized MR signal samples produced by the RF system 126 are received by the data acquisition server 120. The data acquisition server 120 operates in response to instructions downloaded from the workstation 110 to receive the real-time MR data and provide buffer storage such that no data is lost by data overrun. In some scans the data acquisition server 120 does little more than pass the acquired MR data to the data processor server 122. However, in scans that require information derived from acquired MR data to control the further performance of the scan, the data acquisition server 120 is programmed to produce such information and convey it to the pulse sequence server 118. For example, during prescans MR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process MR signals used to detect the arrival of contrast agent in a magnetic resonance angiography (MRA) scan. In all these examples the data acquisition server 120 acquires MR data and processes it in real-time to produce information that is used to control the scan.

The data processing server 122 receives MR data from the data acquisition server 120 and processes it in accordance with instructions downloaded from the workstation 110. Such processing may include, for example: Fourier transformation of raw k-space MR data to produce two or three-dimensional images; the application of filters to a reconstructed image; the performance of a backprojection image reconstruction of acquired MR data; the calculation of functional MR images; the calculation of motion or flow images, etc.

Images reconstructed by the data processing server 122 are conveyed back to the workstation 110 where they are stored. Real-time images are stored in a data base memory cache (not shown) from which they may be output to operator display 112 or a display 142 that is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 110. The workstation 110 may be used by an operator to archive the images, produce films, or send the images via a network to other facilities.

Figure 2:
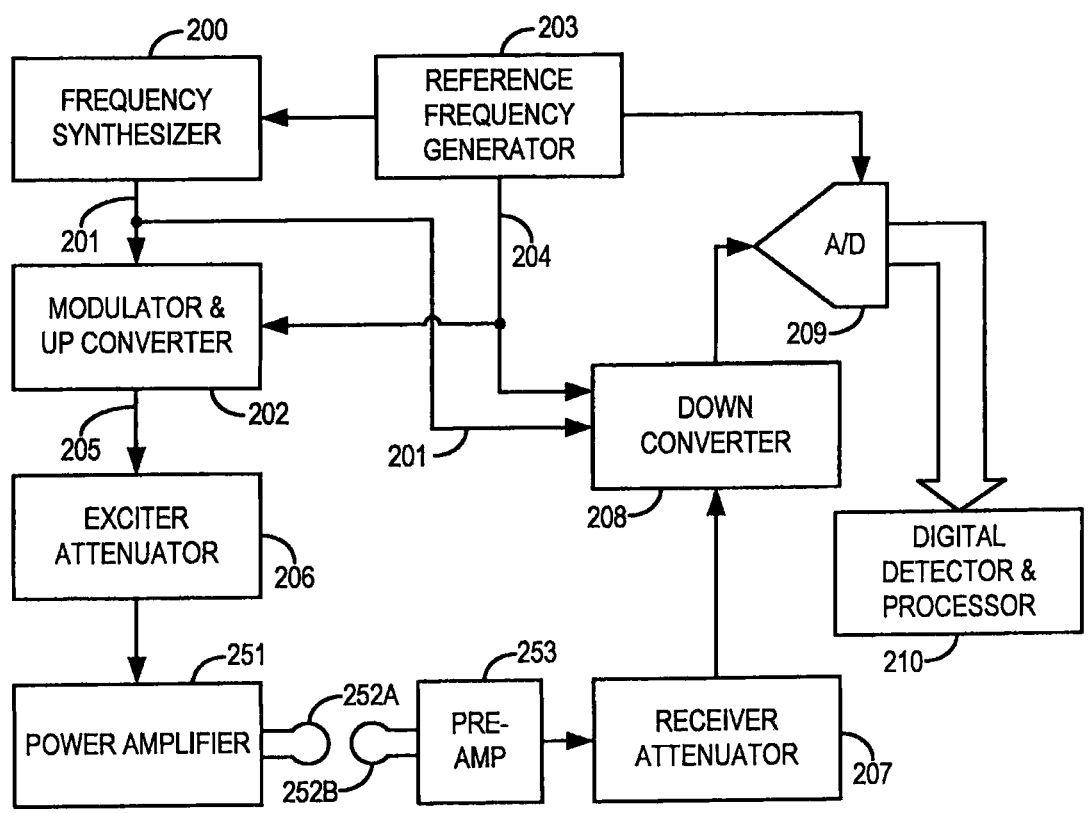
FIG. 2 is an electrical block diagram of the transceiver which forms part of the MRI system of FIG. 1.

As shown in FIG. 1, the radiofrequency ("RF") system 126 may be connected to the whole body RF coil 134, or as shown in FIG. 2, a transmitter section of the RF system 126 may connect to one RF coil 252A and its receiver section may connect to a separate RF receive coil 252B. Often, the transmitter section is connected to the whole body RF coil 134 and each receiver section is connected to a separate local coil 252B.

Referring particularly to FIG. 2, the RF system 126 includes a transmitter that produces a prescribed RF excitation field. The base, or carrier, frequency of this RF excitation field is produced under control of a frequency synthesizer 200 that receives a set of digital signals from the pulse sequence server 118. These digital signals indicate the frequency and phase of the RF carrier signal produced at an output 201. The RF carrier is applied to a modulator and up converter 202 where its amplitude is modulated in response to a signal, R(t), also received from the pulse sequence server 118. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 205 is attenuated by an exciter attenuator circuit 206 that receives a digital command from the pulse sequence server 118. The attenuated RF excitation pulses are applied to the power amplifier 251 that drives the RF coil 252A.

Referring still to FIG. 2 the signal produced by the subject is picked up by the receiver coil 252B and applied through a preamplifier 253 to the input of a receiver attenuator 207. The receiver attenuator 207 further amplifies the signal by an amount determined by a digital attenuation signal received from the pulse sequence server 118. The received signal is at or around the Larmor frequency, and this high frequency signal is down converted in a two step process by a down converter 208 that first mixes the MR signal with the carrier signal on line 201 and then mixes the resulting difference signal with a reference signal on line 204. The down converted MR signal is applied to the input of an analog-to-digital (A/D) converter 209 that samples and digitizes the analog signal and applies it to a digital detector and signal processor 210 that produces 16-bit in-phase (I) values and 16-bit quadrature (Q) values corresponding to the received signal. The resulting stream of digitized I and Q values of the received signal are output to the data acquisition server 120. The reference signal, as well as the sampling signal applied to the A/D converter 209, are produced by a reference frequency generator 203.

To properly suppress either lipid or water signals in a reconstructed SSFP image, the pulse repetition period ("TR") must be very short. The LCSSFP method described in U.S. Pat. No. 6,307,368, for example, acquires two k-space image data sets using different RF pulse phase schedules during each of the two image acquisitions. When the two image data sets are combined in one manner, lipid signals are suppressed, and when they are combined in another manner, the water signals are suppressed. This prior method works best when the phase difference of the water and fat spins is 180 degrees, and in a SSFP pulse sequence this translates to an optimal TR of 2.2 ms when implemented in 1.5 Tesla polarizing field.

Figure 3:
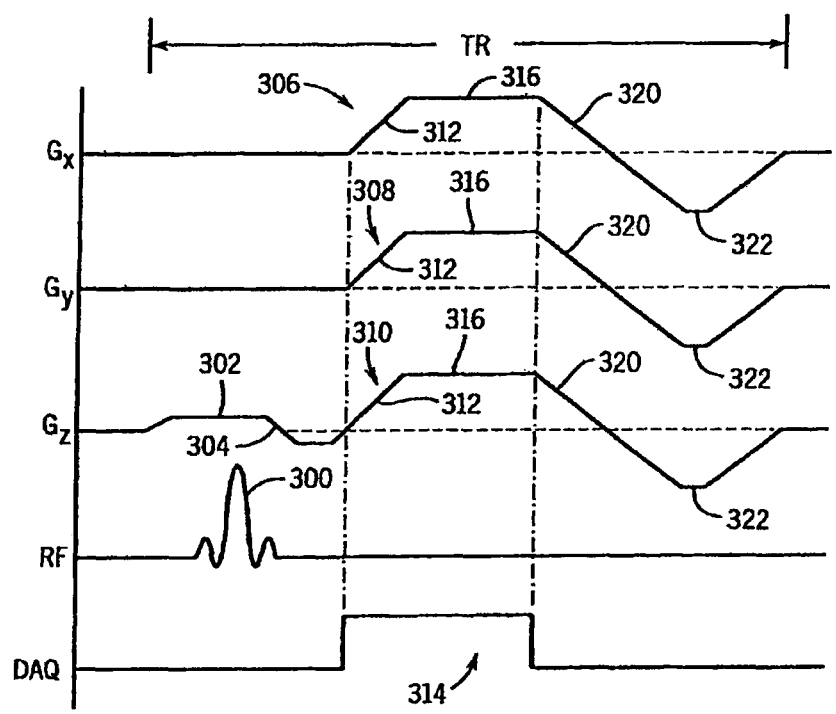
FIG. 3 is a graphic representation of a prior art pulse sequence used to acquire SSFP NMR data with the MRI system of FIG. 1.
Figure 4:
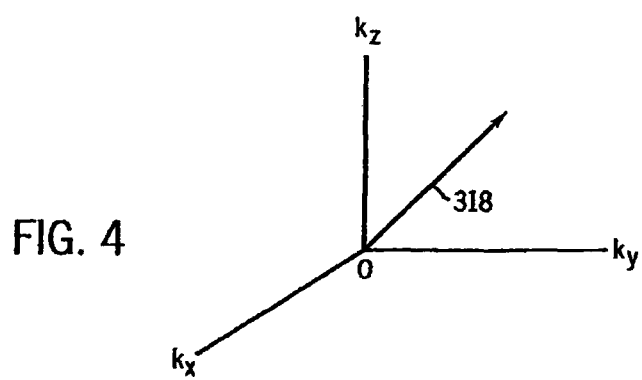
FIG. 4 is a graphic representation of the radial trajectory of k-space samples acquired with the pulse sequence of FIG. 3.

Because no separate and time consuming phase encoding gradient pulses are required, a projection reconstruction pulse sequence is employed to achieve these very short repetition periods ("TR"). Referring to FIG. 3, a typical 3D projection reconstruction pulse sequence includes an RF pulse 300 which is produced in the presence of a weak slab select $G_z$ gradient pulse 302 to excite spins throughout the 3D volume of interest. The excited spins are rephased by a short $G_z$ rephasing pulse 304 and then three readout gradient waveforms 306, 308 and 310 are produced along respective gradient axes $G_x$, $G_y$ and $G_z$. These readout gradient waveforms have ramp-up portions 312 during which the gradient fields rise to values required to establish the radial readout direction of the three separate fields for this particular SSFP sequence. During the scan, of course, this pulse sequence is repeated many times and the radial readout direction is stepped to different k-space directions to sample throughout a spherical volume of k-space. NMR data is acquired during the short interval indicated at 314 during which the readout waveforms 306, 308 and 310 ramp-up at 312 and maintain a flattop interval 316. As shown in FIG. 4, during this short readout interval 314 NMR signals are acquired to sample k-space along a single radial trajectory 318 that extends from the center of k-space to the periphery of the spherical volume of interest.

Following the data acquisition, the readout gradients 306, 208 and 310 are ramped down in amplitude at 320 and then ramped up again with the opposite polarity to produce rephasing lobes 322. The negative rephasing lobes 322 have the same area as the positive lobes such that the transverse spin magnetization is rephased before the start of the subsequent pulse sequence. Such rephasing is required in all SSFP pulse sequences because there is significant transverse magnetization carried over from one pulse sequence to the next.

It can be seen in FIG. 3 that the sampling efficiency of this typical near-zero-TE, 3D projection reconstruction pulse sequence is low. Data is acquired over a relatively small portion of the TR time.

Figure 5:
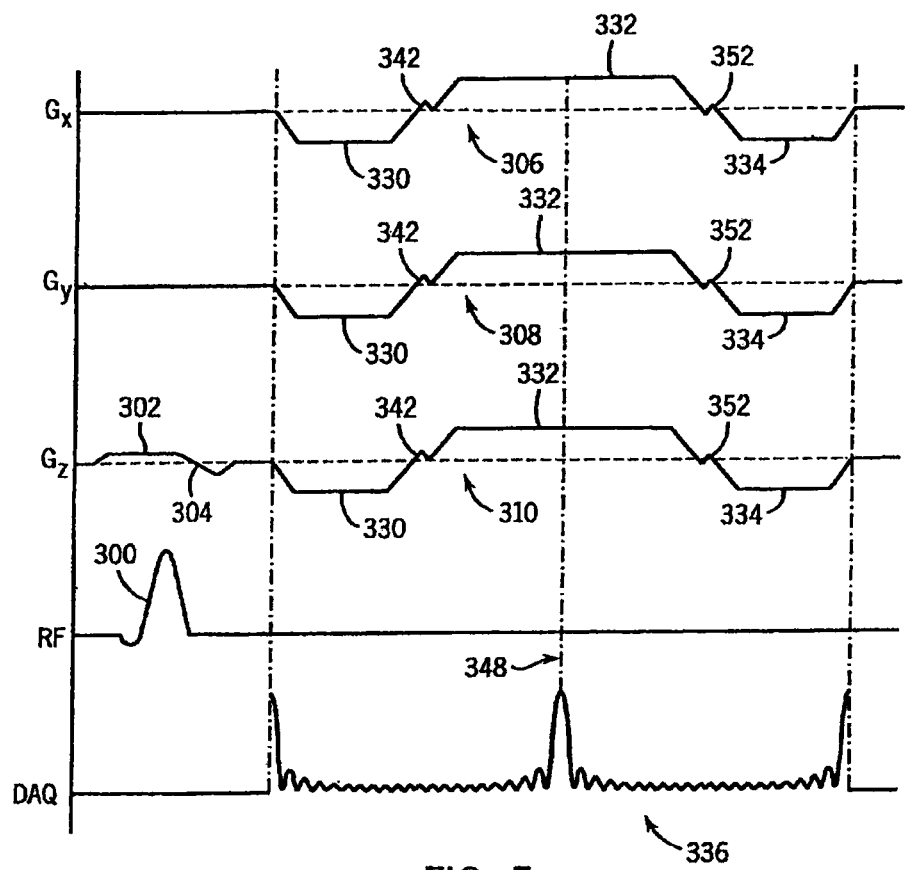
FIG. 5 is a graphic representation of a first preferred pulse sequence used to acquire SSFP NMR data according to the present invention.

Referring particularly to FIG. 5, the data gathering efficiency of a 3D projection reconstruction pulse sequence can be increased by acquiring NMR data throughout the playout of the readout gradient waveforms. In the first embodiment of FIG. 5, the readout gradient waveforms 306, 308 and 310 are comprised of an initial dephasing lobe 330, followed by a readout lobe 332 and then a rephasing lobe 334. Unlike prior pulse sequences, the frequency of the RF pulse 300 is set midway between the fat and water resonant frequencies (63.8 MHz at 1.5 T) and NMR data 336 is acquired during the entire playout of these readout gradient waveforms 306, 308 and 310 for two separate k-space data sets.

Figure 6:
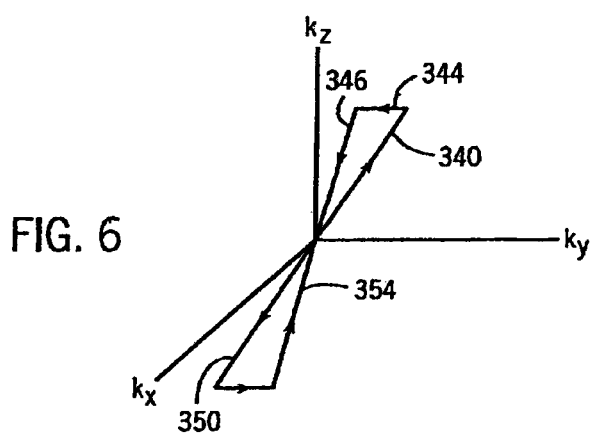
FIG. 6 is a graphic representation of the radial trajectories of k-space samples acquired with the pulse sequence of FIG. 5.

In this first embodiment four radial sampling trajectories are acquired during each pulse sequence. Referring to FIGS. 5 and 6, during the application of dephasing lobes 330 NMR data is acquired and k-space is sampled along a first radial trajectory 340. This sampling is radially outward from the center of k-space and it is performed during the ramps and plateau of the dephasing lobe 330. A small rotation gradient blip 342 is then applied to move the k-space sampling to another radial trajectory starting point as indicated by arrow 344. During the first half of the readout gradient lobe 332 NMR data is sampled along a second radial trajectory 346 back to the center of k-space. At the center of the readout gradient lobe indicated by dotted line 348, the level of each readout gradient $G_x$, $G_y$ and $G_z$ is changed slightly to redirect sampling to another radial direction. As a result, during the playout of the remaining half of the readout gradient lobe 332, k-space data is acquired along a third radial sampling trajectory 350 which is directed away from the center of k-space. NMR data is thus acquired during the playout of the entire readout lobe 332—including its ramps.

Referring still to FIGS. 5 and 6, prior to playing out the rephasing readout gradient lobes 334 another small rotation gradient blip 352 is applied to move the k-space sampling to another radial trajectory. As a result, when NMR signal acquisition is performed during the subsequent rephasing lobe 334, a fourth k-space sampling trajectory 354 is traversed back to the center of k-space. At the completion of the pulse sequence, therefore, a total of four different radial trajectories in k-space capable of creating isotropic 256×256×256 pixel images have been sampled during a TR period from 3.7 ms to 4.4 ms.

Figure 7:
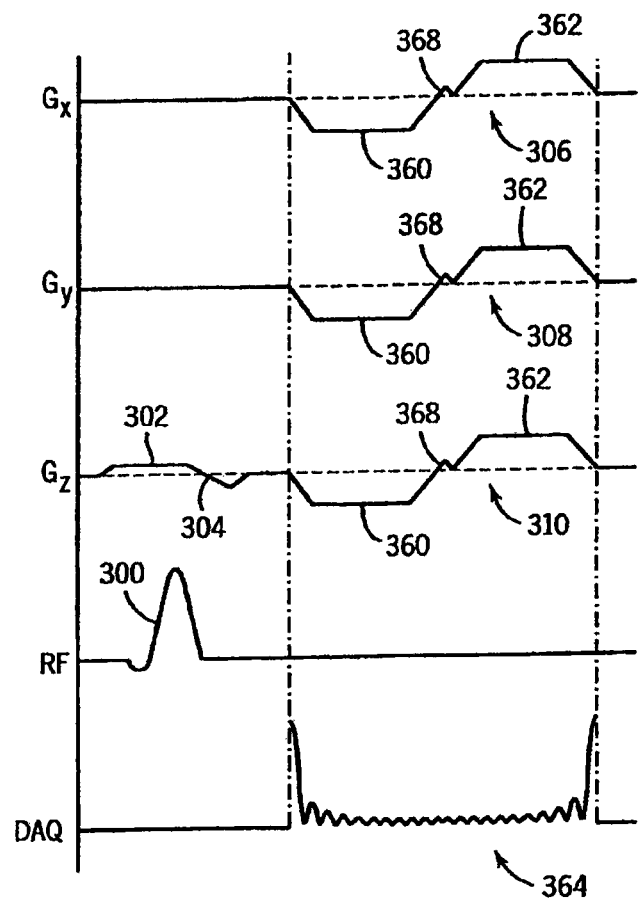
FIG. 7 is a graphic representation of a second preferred pulse sequence used to acquire SSFP NMR data according to the present invention.

Another embodiment of the 3D projection reconstruction pulse sequence is shown in FIG. 7. In this embodiment only two radial projections are acquired, but the pulse sequence can be performed in a shorter repetition period (TR) than the first embodiment described above. As with the pulse sequences described above, transverse magnetization is produced by the application of an rf excitation pulse 300 at a frequency midway between fat and water resonances and in the presence of a weak, slab-select $G_z$ gradient pulse 302. This magnetization is rephased by a small negative $G_z$ gradient lobe 304 and then the three readout gradient waveforms 306, 308 and 310 are played out.

Figure 8:
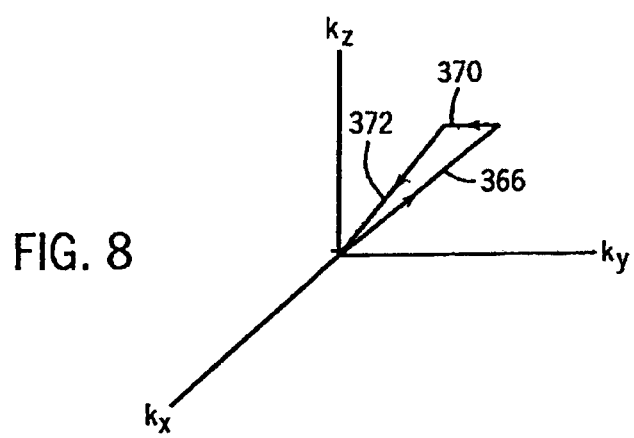
FIG. 8 is a graphic representation of the radial trajectories of k-space samples acquired with the pulse sequence of FIG. 7.

Referring still to FIG. 7, the readout gradient waveforms 306, 308 and 310 are each comprised of a dephasing lobe 360 followed by a rephasing lobe 362. An NMR signal 364 is acquired during nearly this entire period. More specifically, during this playout of the dephasing lobe 360, including its ramps, a first readout k-space trajectory indicated by arrow 366 in FIG. 8 is sampled and stored in one k-space data set. A small rotation gradient blip 368 is then applied along each gradient axis $G_x$, $G_y$ and $G_z$ to move the k-space sampling to another radial trajectory starting point as indicated by arrow 370. During the subsequent rephasing lobe 362, including its ramps, a second radial trajectory 372 is sampled back to the center of k-space and stored in a second k-space data set.

Figure 12:
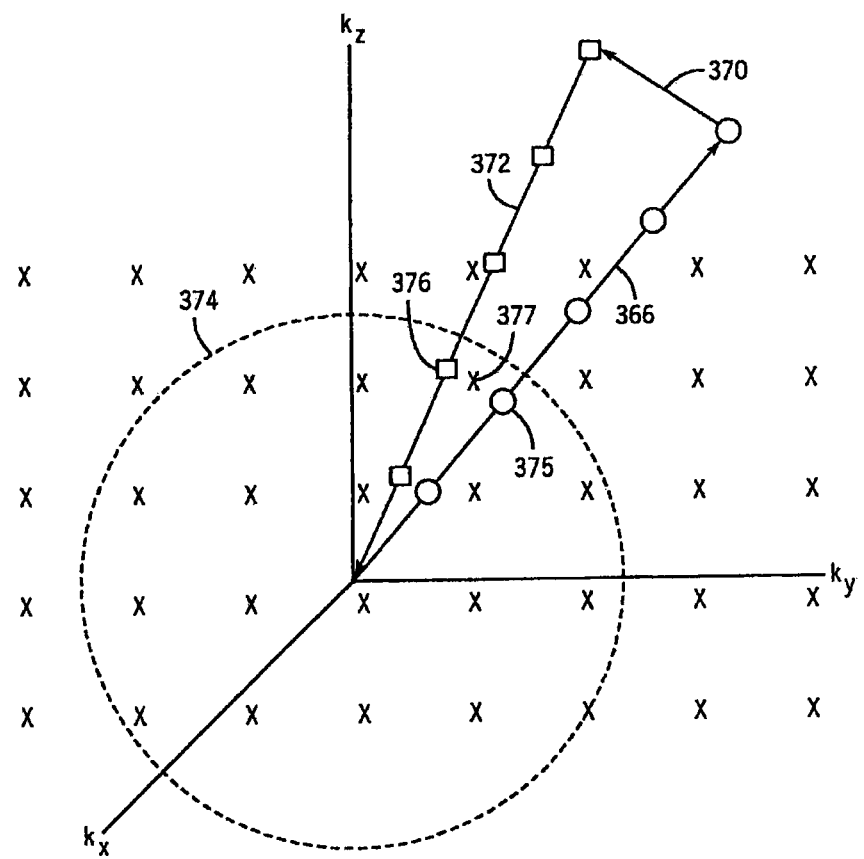
FIG. 12 is a pictorial representation of k-space depicting the sampling points and the points calculated in the method of FIG. 9A.
Figure 13A:
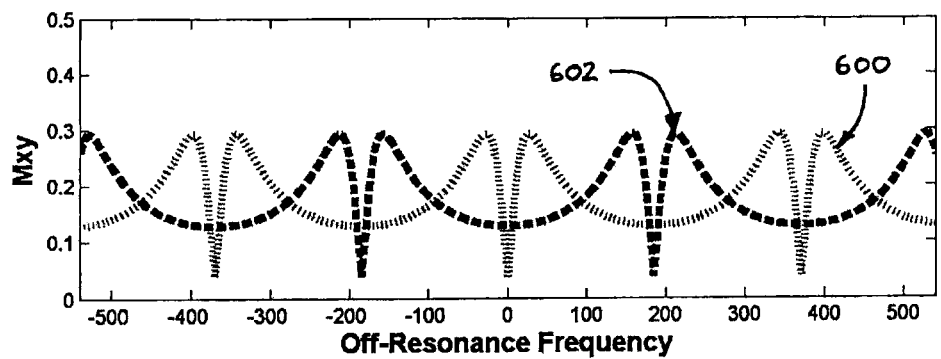
FIG. 13A is a graphic representation of the magnitude of a first and second echo signal acquired when practicing the method set forth in FIG. 9A.
Figure 13B:
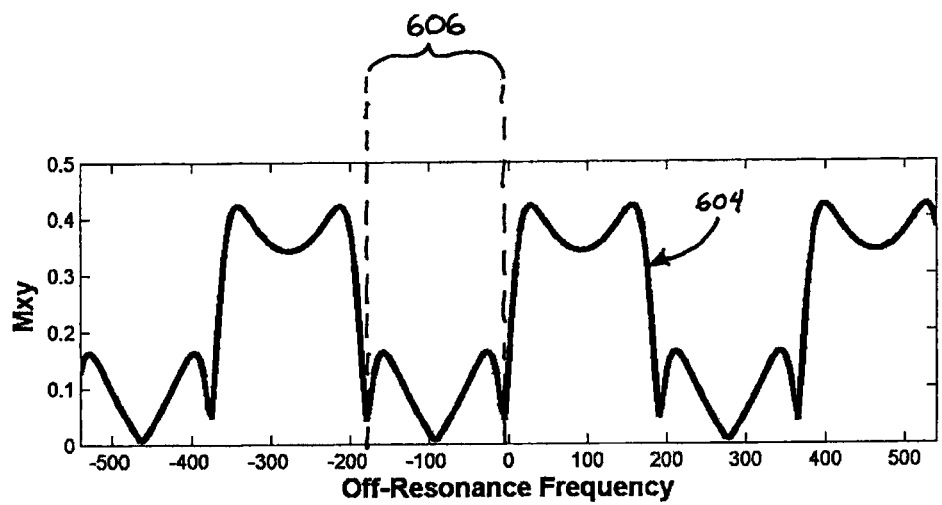
FIG. 13B is a graphic representation of the linearly combined magnitude of a first and second echo signal acquired when practicing the method set forth in FIG. 9A.

A discovery of the present invention is that two echo signals acquired using a projection reconstruction pulse sequence can be combined to suppress either the fat or water signal even though they are sampling slightly different radial trajectories in k-space. However, as will be described below, the suppression provided solely by this linear combination is inconsistent and further processing is required to achieve appreciable suppression of unwanted signals. Referring to FIG. 12, k-space samples acquired with a first echo signal to produce the first readout k-space trajectory 366 are indicated by circles and the k-space samples acquired with the second echo signal to produce the second readout k-space trajectory 372 are indicated by squares. By setting the pulse sequence parameters such that there is a 90 degrees phase shift in these two echo signals due to precession in the polarizing magnetic field, they can be combined in either of two ways to suppress water or fat signal. FIG. 13A shows the relative phases of the water and fat spin signals in the first echo at TE1=0.3 ms and FIG. 13B shows their relative phases in the second echo at TE2=1.9 ms. By shifting the phase of the second echo k-space samples by +90 degrees and adding them to the corresponding radial k-space samples in the first echo signal, the fat signals cancel and the water signals add as shown in FIG. 13C. On the other hand, if the phase of the second echo k-space samples are shifted by −90 degrees and added to corresponding k-space samples in the first echo, the water signals cancel and the fat signals add as shown in FIG. 13D. The ideal case is illustrated in FIG. 13 where the time between echo signals is 2.2 ms at 1.5 T and the water and fat signals rotate 180 degrees in phase relative to each other. In the currently preferred embodiment the time between echo signals is 1.6 ms and the combination of the signals is not ideal. As will be described in detail below, the echo signals are added during the regridding step.

Figure 9A:
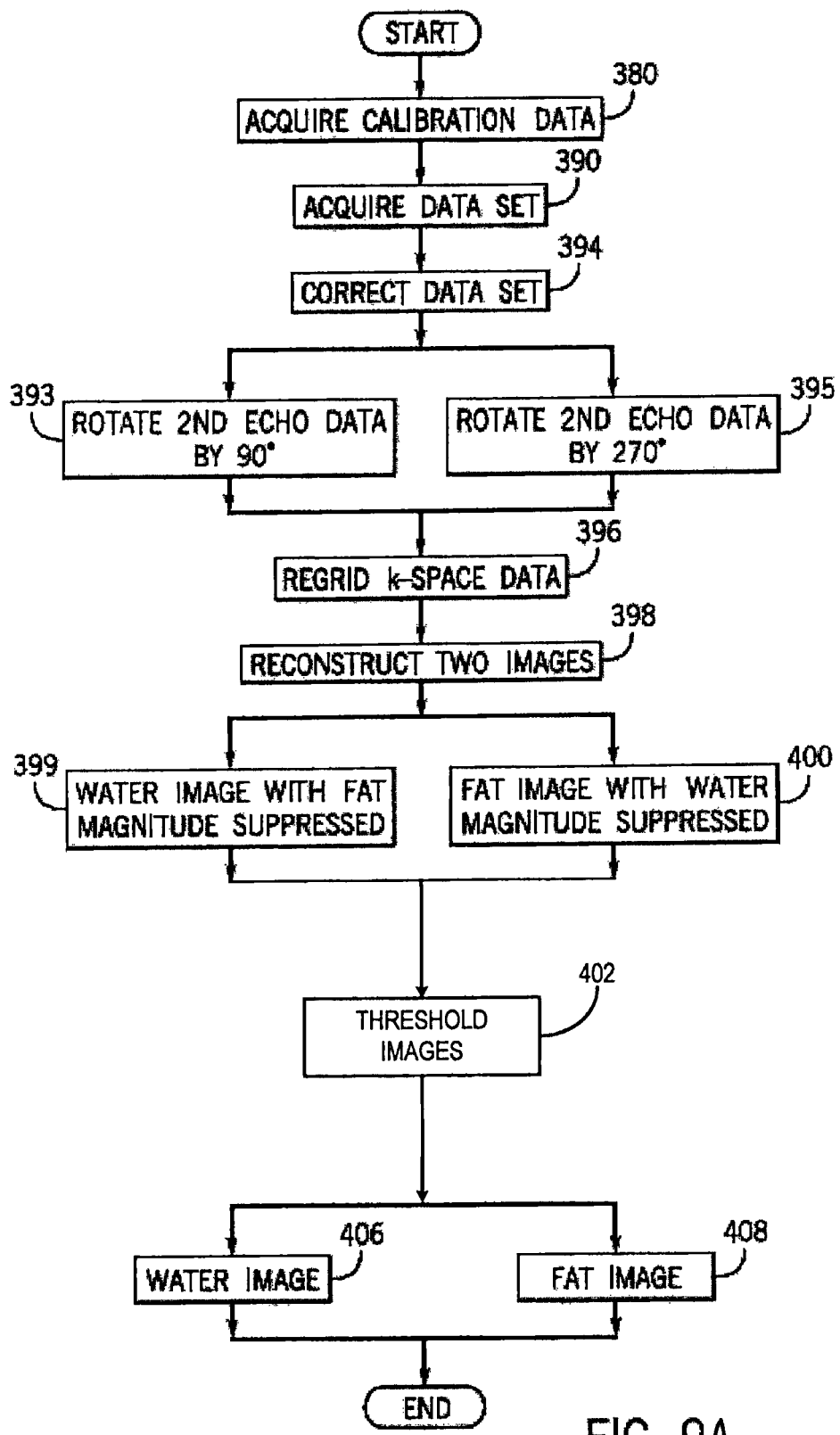
FIG. 9A is a flowchart setting forth the steps of a method for practicing the present invention.

A method of practicing the present invention is depicted in FIG. 9A. The first step in this method is to acquire calibration data for the selected readout gradient waveform as indicated by process block 380. This calibration data is needed to correct for system instabilities such as eddy currents which create errors in the actual k-space location that is being sampled while the readout gradient is being produced as described by Duyn J H, Yang Y, Frank J A, Veen J W. "Simple Correction Method For K-space Trajectory Deviations In MRI", J. Magn. Reson. 1998; 132:150-153.

Figure 10:
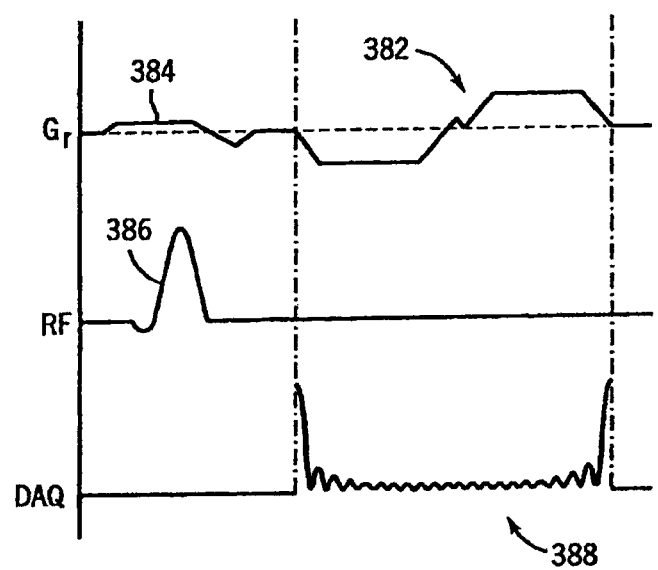
FIG. 10 is a graphic representation of a calibration pulse sequence used to practice the method of FIG. 9A.
Figure 11A:
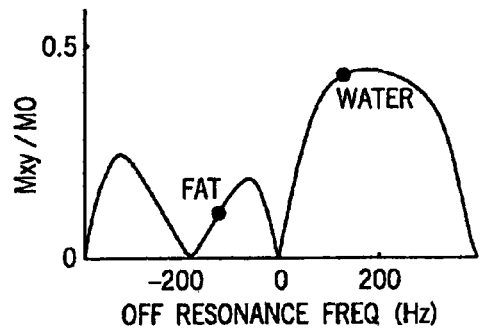
FIGS. 11A-11C are graphic presentations of the discrimination between fat and water signal.
Figure 11B:
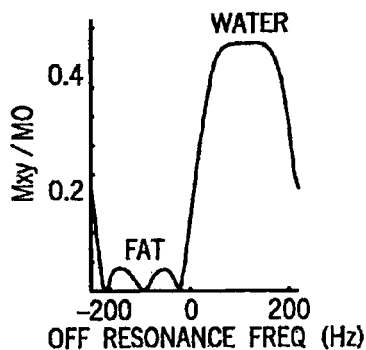
Figure 11C:
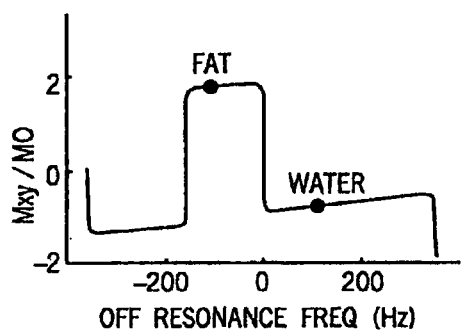

The calibration data is acquired using a pulse sequence such as that shown in FIG. 10. The readout gradient waveform to be calibrated is indicated at 382 and it is preceded by a thin slice select gradient waveform 384 directed along the same gradient axis. An RF excitation pulse 386 is produced during the application of slice select gradient 384 and the NMR signal is sampled during a window 388 as the gradient waveform 382 is played out. In this example, the readout gradient waveform being calibrated is that used in the pulse sequence of FIG. 7, and the NMR signal is sampled during the period 388 in exactly the same way it is sampled during the performance of the pulse sequence. A thin slice is excited (e.g., 1.5 mm) and this slice is located a distance (D) away from the system isocenter which is large relative to slice thickness (e.g., 30 mm).

The calibration pulse sequence is performed once for each gradient axis $G_x$, $G_y$ and $G_z$. In addition, after each acquisition the calibration pulse sequence is repeated, but with the test gradient 382 set to zero to acquire a reference NMR signal. In other words, calibration data and reference data are acquired for each orthogonal gradient axis. The phase $\phi(t)$ of the acquired calibration data and reference data for each gradient axis (x, y and z) is then calculated from the sampled quadrature components Q and I ($\phi = \tan^{-1} Q/I$). The reference phase data is then subtracted from the calibration phase data to produce three sets of corrected calibration phase data:

$$\Delta\phi_x(t) = D_x k_x(t)$$

$$\Delta\phi_y(t) = D_y k_y(t)$$

$$\Delta\phi_z(t) = D_z k_z(t)$$

where: $D_x$, $D_y$, and $D_z$ are distances of the respective calibration slices from system isocenter; and $k_x$, $k_y$, and $k_z$ are locations in k-space of excited spins along respective k-space axes. In one embodiment, calibration data is acquired twenty times for each gradient axis and the results averaged. This step requires 500 to 1,000 ms of acquisition time.

Referring again to FIG. 9A, two data sets are then acquired as indicated at process block 390 using one of the 3-D projection reconstruction pulse sequences described above and shown in FIG. 5 or 7. In both preferred embodiments described above the pulse sequences are repeated to sample radial trajectories along many different trajectories until the entire 3D k-space volume is sampled to the prescribed density. This is accomplished by modulating the relative amplitudes of the respective readout gradient waveforms $G_x$, $G_y$ and $G_z$. The angular spacing is chosen such that a uniform distribution of k-space sample points occurs at the peripheral boundary ($k_{max}$) of the sampled k-space sphere. The acquisition is done on a 1.5 T scanner with a 40 mT/m maximum peak gradient amplitude and a 150 mT/m is maximum slew rate. A receiver bandwidth of ±125 kMz was used to achieve the shortest TR possible. A readout resolution equivalent to 128 radial k-space sample points was used for each radial trajectory, giving an equivalent image matrix size of 256×256×256 over a 24 cm spherical FOV with 0.94 mm isotropic resolution. The center frequency for the exam is set halfway between the fat and water resonance peaks.

As indicated at process block 394, the next step is to correct the k-space data sets for sampling position errors using the three sets of calibration phase data $\Delta\phi_x(t)$, $\Delta\phi_y(t)$, $\Delta\phi_z(t)$. First, the actual k-space location from which NMR signals are sampled during a projection acquisition along each of the gradient axes x, y and z is calculated:

$$k_x(t) = \frac{\Delta\phi_x(t)}{D_x}$$

$$k_y(t) = \frac{\Delta\phi_y(t)}{D_y}$$

$$k_z(t) = \frac{\Delta\phi_z(t)}{D_z}.$$

These corrected k-space sampling points for each gradient axis are then combined to provide the actual sampling points $k_{actual}(t)$ for each acquired sampling trajectory by calculating the following dot product:

$$k_{actual}(t) = [\, k_{xmax} \quad k_{ymax} \quad k_{zmax} \,] \cdot \begin{bmatrix} k_x(t) \\ k_y(t) \\ k_z(t) \end{bmatrix}$$

where: $k_{xmax}$, $k_{ymax}$, $k_{zmax}$ = are the endpoints of the acquired sampling trajectory on a unit circle. For example, if the acquired sampling trajectory is directed along the x-axis only, $k_{xmax}$ is "1" and the $k_{ymax}$ and $k_{zmax}$ values are zero. In this case the actual sampling points $k_{actual}(t) = k_x(t)$. Of course, nearly all the acquired sampling trajectories are directed along 2 or 3 gradient axes and the actual sampling points $k_{actual}(t)$ are a combination of the three corrected k-space sampling points $k_x(t)$, $k_y(t)$ and $k_z(t)$.

This correction of the acquired k-space data set is performed on each trajectory to produce acquired and corrected k-space data sets. It should be apparent, however, that this correction does not actually alter the sampled NMR signals, but instead, correctly identifies the locations in k-space from which the samples were actually obtained. The actual implementation of these corrections occurs in the regridding process which follows.

As indicated by process blocks 393 and 395, the next step is to change the phase of each complex k-space sample in the data set formed by the second echo signals by +90 degrees and −90 degrees (or +270 degrees) respectively. These two phase shifted second echo data sets are then combined with two copies of the first echo data set to form two complete k-space data sets. These phase shifted values are combined to suppress water or fat only at k-space sample points throughout the center region of k-space. The k-space data set which is fat suppressed is therefore comprised of peripheral k-space samples from the first and second echoes, central k-space samples from the first echo, and central k-space samples from the second echo phase shifted +90 degrees. Likewise, the k-space data set which is water suppressed is comprised of peripheral k-space samples from the first and second echoes, central k-space samples from the first echo, and central k-space samples from the second echo phase shifted −90 degrees.

In the preferred method this combination of the k-space data sets occurs during the performance of a regridding step indicated at process block 396 to place each of these complete k-space data sets on a 3D Cartesian grid. This is done so that a 3DFT image reconstruction can be performed. Such regridding methods are well known in the art and is described, for example, in J. Jackson et al, "Selection Of Convolution Function For Fourier Inversion Using Gridding," IEEE Trans. Med. Imaging, 10, 473-478, 1991. This regridding step is performed with the actual sampling trajectories $k_{actual}(t)$ rather than the theoretical radial sampling trajectories. The interpolation process that characterizes the regridding of radial sample points to Cartesian sampling points thus employs the actual sample points $k_{actual}(t)$ for each trajectory. The resulting 3D array of k-space data are density compensated with a $\rho^2$ filter, where $\rho$ is the k-space radius of the acquired data point being interpolated onto the Cartesian grid. The $\rho=0$ point is weighted according to the finite sphere of volume that it samples, similar to the correction proposed for 2D projection filters. The kernel used for the regridding process is either a simple triangle function, which is computationally very fast, or a Kaiser-Bessel function, which has the advantage of reducing aliased energy from the regridding process.

The combination of the k-space data sets that takes place during the regridding step is illustrated in FIG. 12 where the x's are the Cartesian grid points. For any given number of acquired projections, there will be a circular central region of k-space indicated by dashed lines 374 for which the angular distance between acquired k-space samples will be equal or less than one-half the spacing between grid points ($\leq 0.5$/FOV). Within this central region, data at the same k-space radius and from adjacent projections are interpolated to primarily the same Cartesian grid point. For example, a k-space sample 375 in a first readout k-space trajectory 366 is combined with a k-space sample 736 to form a Cartesian grid point value 377. This combination through regridding interpolation results in fat and water separation for spatial frequencies within this central region 374. As one moves radially outward from the central region 374 the angular spacing between acquired k-space samples grows relative to the fixed Cartesian grid point spacing, and at these spatial frequencies the fat and water separation does not occur because the regridding operation will interpolate the acquired k-space data to more than one Cartesian grid point. Since the vast majority of the signal from fat or water originates from the low special frequencies near the center of k-space good suppression is achieved even though the desired k-space data combination does not occur at the periphery of k-space.

The size of the central region 374 of k-space in which water and fat suppression occurs during the regridding step 396 is determined by the Cartesian grid sample spacing and the number of acquired projections. In the preferred embodiment the Cartesian grid sample spacing is set equal to the radial sampling interval of the acquired projections which is 1/FOV. The regridding operation is an interpolation process where the acquired projection k-space data is interpolated to estimate the k-space data at each sample location on the Cartesian grid. It can also be viewed as a convolution operation where the acquired projection k-space data is convolved with a function and the output is calculated at each sample point on the Cartesian grid. The convolution function is set so that only acquired k-space projection samples within approximately 1/FOV of a Cartesian sample location contribute to that output. It can be appreciated that near the center of k-space where the spacing of acquired k-space projection samples are less than 1/FOV apart, k-space samples from two adjacent projections (i.e., one with phase shift and the other without phase shift) will be combined together at some Cartesian sample locations. The higher the number of projections that are acquired the further out from the center of k-space this condition exists, and hence the further out the fat/water suppression combination occurs.

As indicated at process block 398 the two regridded k-space data sets are then Fourier-transformed in all three directions to reconstruct a water image 399 and a fat image 400 respectively. In the preferred embodiments each sampled radial trajectory extends from the center to the periphery of the k-space volume in only one direction but samples reflected about the k-space origin are not acquired. The missing data is synthesized with a 3D homodyne process such as that described by Noll and Nishimura, "Homodyne Detection In Magnetic Resonance Imaging," IEEE Transactions on Medical Imaging, Vol. 10, No. 2, June 1991 and in U.S. Pat. No. 5,243,284.

While both a water image and a fat image may be produced, in most clinical applications the water image is used. More specifically, the three-dimensional water image may be examined by taking two-dimensional slices through the three-dimensional image to examine specific anatomy. Or, the 3-D image may be projected on to a two-dimensional image plane at a selected projection angle using any of the well known projection techniques. As discussed above, despite the level of water and fat suppression provided by the above detailed steps, further suppression using information about the phase difference between the first and second k-space data sets is applied to produce more accurate suppression in the images. Therefore, thresholding is applied to the produced water and fat images to achieve this end, as indicated at step 402, and as will be described in detail below. In this manner a water and fat image having substantially suppressed signals from fat and water, respectively, are produced in steps 406 and 408, respectively.

Figure 9B:
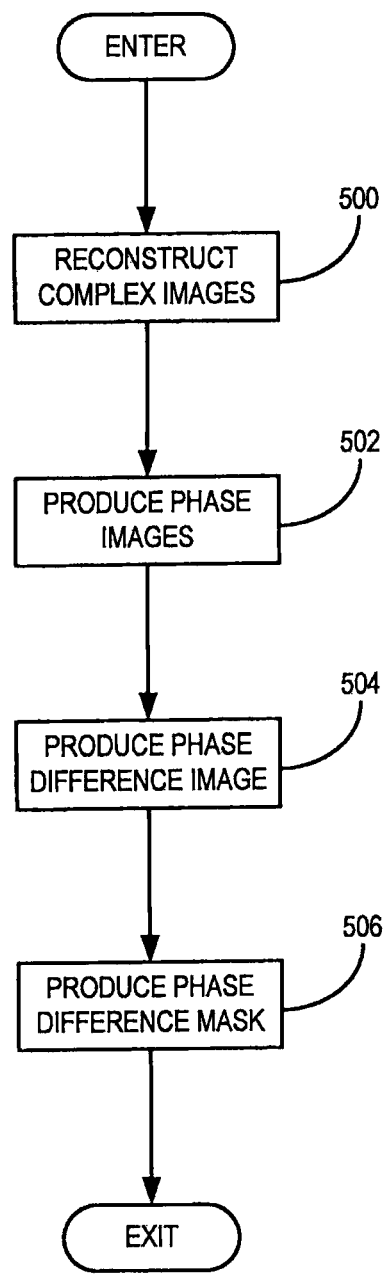
FIG. 9B is a flowchart setting forth the steps of a method for producing a phase difference mask, which forms a part of the method of FIG. 9A.

Referring particularly now to FIG. 9B, the thresholding applied in step 402 is achieved by producing a phase difference mask, which is subsequently applied to the water image to further suppress image pixels indicative of fat, or to the fat image to further suppress image pixels indicative of water. First, images are reconstructed from k-space data sets formed from the first and second echoes, as indicated in step 500. In this manner an image representative of the MR signals associated with the first echo and an image representative of the MR signals associated with the second echo are reconstructed. As shown in FIG. 13A, the magnitude 600 in the first image is different than the magnitude in the second image 602. The resulting magnitude 604 of the linear combination of these two images is shown in FIG. 13B. It can be seen that the linear combination results in signal magnitude remaining in the suppression band 606 due to differences in the magnitude between passes. As a result, the linear combination, while helpful in reducing some of the signal from fat, inconsistently suppresses signals from fat.

Figure 14A:
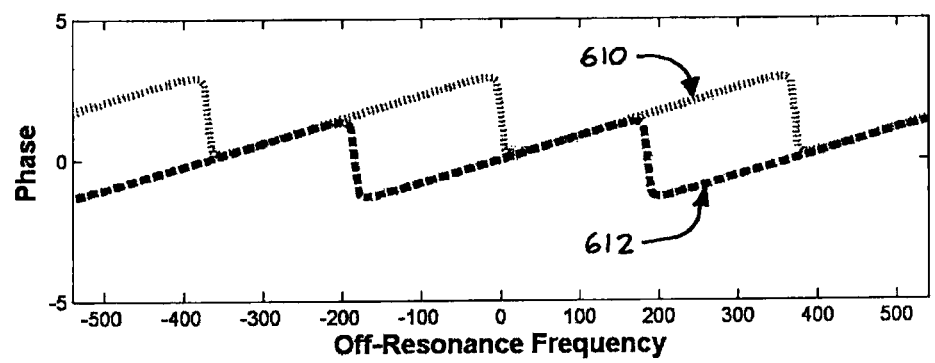
FIG. 14A is a graphic representation of the phase of a first and second echo signal acquired when practicing the method set forth in FIG. 9A.
Figure 14B:
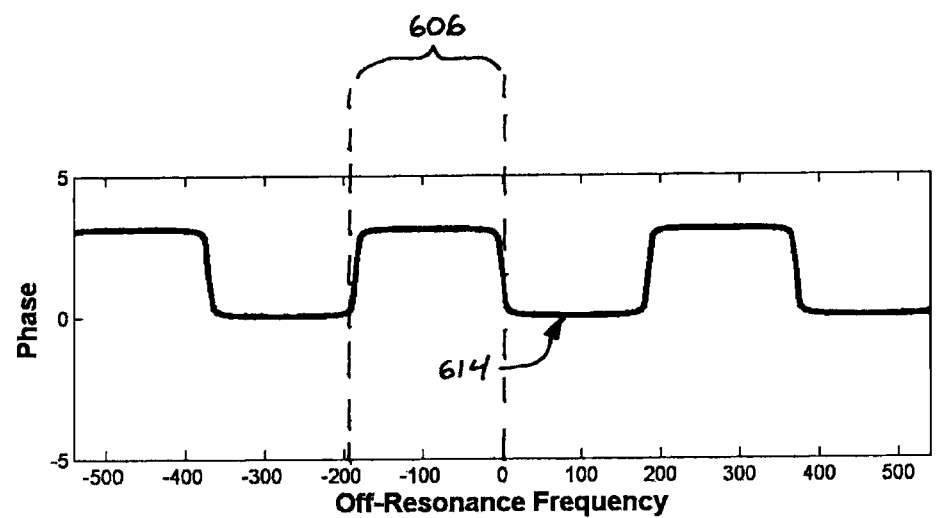
FIG. 14B is a graphic representation of the phase difference between a first and second echo signal acquired when practicing the method set forth in FIG. 9A.

As shown in FIG. 14A, the phase 610 in the first image is different that the phase 612 in the second image reconstructed in step 500. However, the phase variation is more uniform that the magnitude variation. As a result, it can be exploited to more accurately suppress unwanted signal in the water and fat images produced in step 399 and 400, respectively. A first and second phase image are produced by taking the phase component of each voxel in the complex images reconstructed in step 500, as indicated in step 502. Subsequently, these phase images are subtracted to produce a phase difference image, as indicated in step 504. The spectral response of the phase 614 in this phase difference image is shown in FIG. 14B. It can be seen that the phase difference between the first and second echo data produces a uniform spectral response in the suppression band 606, and is likewise uniform in those areas outside of the suppression band. Accordingly, the information in this phase difference image is utilized to threshold the water and fat images.

Referring again to FIG. 9B, this thresholding occurs by first producing a phase difference mask, as indicated in step 506. Each pixel in the phase difference image is evaluated, and the pixel location in the phase difference mask corresponding to those pixels in the phase difference image having a phase difference greater than or equal to a preselected threshold value are given a binary value of zero. For example, a threshold phase difference value of 135 degrees is utilized when producing a phase difference mask that suppresses fat in a water image. Accordingly, those pixel locations in the phase difference mask that are not set to zero by the aforementioned process are given a value of one. This phase difference mask is then applied to the desired image, for example the water image reconstructed in step 399, to produce an image having substantially suppressed signal contribution from an unwanted spin species. It should be appreciated by those skilled in the art that other thresholding techniques may be applied using the information in the phase difference image. For example, a weighting value can be determined for each phase difference value and these weightings applied to the water or fat images to further suppress the unwanted signal.

Figure 15A:
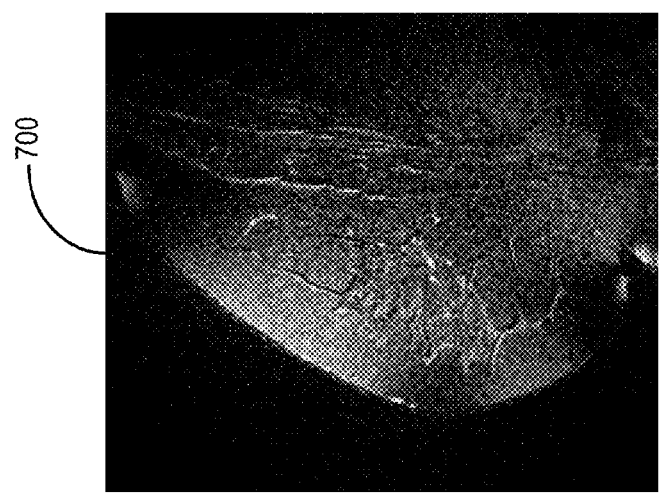
FIGS. 15A-15C are a set of exemplary images produced when practicing the methods set forth in FIGS. 9A and 9B.
Figure 15B:
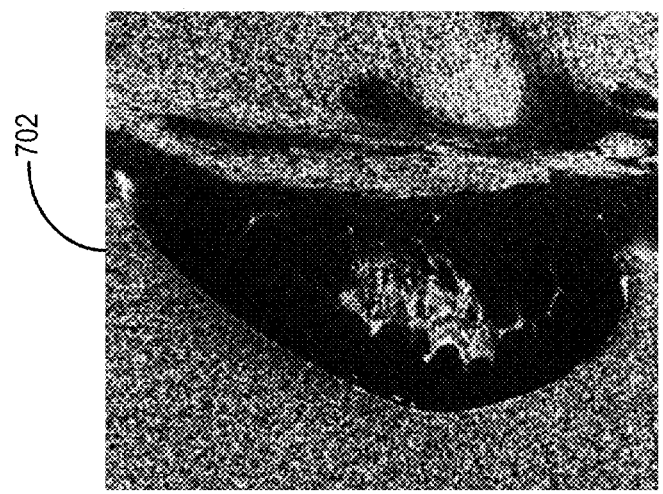
Figure 15B:
Figure 15C:
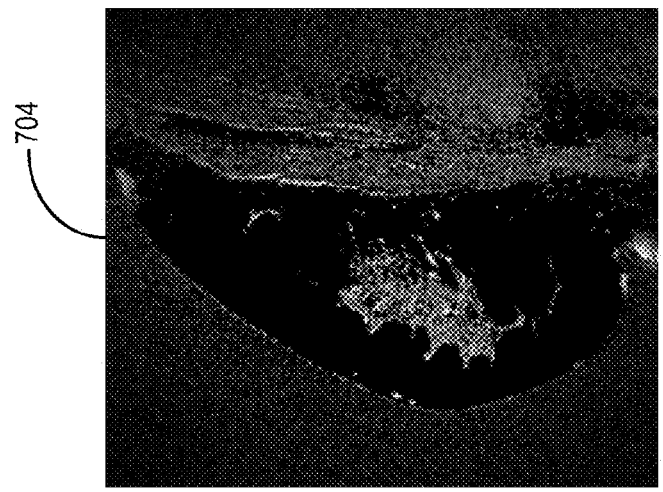

By way of example, and referring now to FIGS. 15A-15C, the aforementioned thresholding process is applied to a water image 700 of a subject's breast. The phase difference image 702 clearly indicates those regions of pixels associated with fat (dark pixels) and those that are not (light pixels). The phase difference mask produced from this phase difference image 702 is subsequently applied to the water image 700 to produce an image having substantially suppressed signal contribution from fat 704. In this manner, regions of tissue not corresponding to fat can be more readily discerned in the image 704.

Using the above-described method, levels of fat suppression are improved from approximately 70 to 100 percent, or substantially full fat suppression. Thus, small and low contrast features that are surrounded by fat are much more evident with this method of fat suppression. Also, providing complete fat suppression may facilitate the use of automated thresholding techniques that aim to detect critical structures of the anatomy and are based on signal differences between these structures and surrounding tissues.

The present invention has been described in terms of one or more preferred embodiments, and it should be appreciated that many equivalents, alternatives, variations, and modifications, aside from those expressly stated, are possible and within the scope of the invention. For example, the present invention can be practiced with any number of pulse sequences, including those that sample k-space in a Cartesian manner. Additionally, the accuracy of the phase difference map can be further facilitated by the use of multi-channel receive coils, which allow for high resolution phase difference maps to be created.

The invention claimed is:

1. A method for producing an image with an MRI system, the steps comprising:
    a) acquiring a first NMR signal at a first echo time and a second NMR signal at a second echo time;
    b) repeating step a) a plurality of times to sample a corresponding plurality of first and second NMR signals;
    c) forming a first k-space data set with the plurality of first NMR signals acquired in steps a) and b);
    d) forming a second k-space data set with the plurality of second NMR signals acquired in steps a) and b);
    e) producing a phase difference image by:
        e)i) producing a first phase image from the first k-space data set formed in step c);
        e)ii) producing a second phase image from the second k-space data set formed in step d);
        e)iii) subtracting the first phase image and the second phase image to produce the phase difference image;
    f) producing a phase shifted k-space data set by rotating a phase of the acquired k-space samples in the first k-space data set formed in step c);
    g) producing a combined k-space data set by combining the phase shifted k-space data set produced in step f) with the second k-space data set formed in step d);
    h) reconstructing a combined image from the combined k-space data set produced in step g); and
    i) producing an image having a substantially suppressed signal contribution from an unwanted spin species by thresholding the combined image reconstructed in step h) based on image intensity values in the phase difference image produced in step e).

2. The method as recited in claim 1 in which step g) includes adding the phase rotated acquired k-space samples in the phase shifted k-space data set produced in step f) to corresponding acquired k-space samples in the second k-space data set formed in step d).

3. The method as recited in claim 1 in which step f) includes rotating the phase of the acquired k-space samples in the first k-space data set formed in step c) approximately 90 degrees.

4. The method as recited in claim 1 in which step f) includes rotating the phase of the acquired k-space samples in the first k-space data set formed in step c) approximately 270 degrees.

5. The method as recited in claim 1 in which step i) includes producing a phase difference mask based on image intensity values in the phase difference image produced in step e) and using the phase difference mask to produce an image having a substantially suppressed signal contribution from an unwanted spin species.

6. The method as recited in claim 5 in which step i) includes multiplying the phase difference mask and the combined image produced in step h).

7. The method as recited in claim 5 in which the phase difference mask is produced by:
    setting pixel values in the phase difference mask to zero if a pixel value in the corresponding phase difference image is above a threshold; and
    setting pixel values in the phase difference mask to one if a pixel value in the corresponding phase difference image is below the threshold.

8. The method as recited in claim 7 in which the threshold is 135 degrees.

9. A method for producing an image with an MRI system, the steps comprising:
    a) acquiring a first NMR signal at a first echo time and a second NMR signal at a second echo time;
    b) repeating step a) a plurality of times to sample a corresponding plurality of first and second NMR signals;
    c) forming a first k-space data set with the acquired plurality of first NMR signals and forming a second k-space data set with the acquired plurality of second NMR signals;

d) reconstructing a first complex image from the first k-space data set and a second complex image from the second k-space data set;
e) producing a phase difference image by subtracting only a phase component portion of the first complex image from only a phase component portion of the second complex image;
f) producing a combined image by:
   f)i) producing a combined k-space data set by combining the first k-space data set formed in step c) and second k-space data set formed in step c);
   f)ii) reconstructing the combined image from the combined k-space data set; and
g) producing an image having a substantially suppressed signal contribution from an unwanted spin species by thresholding the combined image produced in step f) based on image intensity values in the phase difference image produced in step e).

10. The method as recited in claim 9 in which step g) includes:

g)i) producing a phase difference mask based on image intensity values in the phase difference image produced in step e); and
g)ii) multiplying the combined image produced in step f) and the phase difference mask produced in step g)i) to produce the image having a substantially suppressed signal contribution from an unwanted spin species.

11. The method as recited in claim 9 in which step f)j includes:

producing a phase shifted k-space data set by rotating the phase of the acquired k-space samples in the first k-space data set;
producing a combined k-space data set by adding the phase rotated acquired k-space samples in the phase shifted k-space data set to corresponding acquired k-space samples in the second k-space data set; and
reconstructing a combined image from the combined k-space data set.

* * * * *